(12) United States Patent
Clark et al.

(10) Patent No.: US 11,390,181 B1
(45) Date of Patent: Jul. 19, 2022

(54) SYSTEM FOR CHARGING FROM AN ELECTRIC VEHICLE CHARGER TO AN ELECTRIC GRID

(71) Applicant: BETA AIR, LLC, South Burlington, VT (US)

(72) Inventors: Kyle B. Clark, Underhill, VT (US); Vincent Moeykens, Burlington, VT (US); Alexander Hoekje List, South Burlington, VT (US); Herman Wiegman, Essex Junction, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/373,863

(22) Filed: Jul. 13, 2021

(51) Int. Cl.
*H02J 7/00* (2006.01)
*B60L 53/63* (2019.01)
*B60L 53/51* (2019.01)
*G01R 31/08* (2020.01)
*H01M 50/251* (2021.01)

(52) U.S. Cl.
CPC .............. *B60L 53/63* (2019.02); *B60L 53/51* (2019.02); *G01R 31/088* (2013.01); *H01M 50/251* (2021.01); *B60L 2200/10* (2013.01)

(58) Field of Classification Search
None
See application file for complete search history.

(56) References Cited

U.S. PATENT DOCUMENTS

| | | | |
|---|---|---|---|
| 9,043,038 B2 | 5/2015 | Kempton | |
| 9,559,521 B1 | 1/2017 | King | |
| 9,731,615 B2 | 8/2017 | Uyeki et al. | |
| 9,780,567 B2 | 10/2017 | Hunt et al. | |
| 10,090,777 B2 | 10/2018 | Dent | |
| 10,439,428 B2 | 10/2019 | Kydd | |
| 2009/0043520 A1* | 2/2009 | Pollack | B60L 53/65 702/62 |
| 2009/0062967 A1* | 3/2009 | Kressner | B60L 53/68 700/286 |

(Continued)

FOREIGN PATENT DOCUMENTS

| | | |
|---|---|---|
| IN | 201611013453 A | 2/2018 |
| WO | 2020041904 | 3/2020 |

OTHER PUBLICATIONS

Abdelilah Hassoune, Mohamed Khafallah, Abdelouahed Mesbahi3, Improved Control Strategies of Electric Vehicles Charging Station based on Grid Tied PV/Battery System, Jan. 1, 2020.

(Continued)

*Primary Examiner* — Arun C Williams
(74) *Attorney, Agent, or Firm* — Caldwell Intellectual Property Law

(57) ABSTRACT

In an aspect a system for charging from an electric vehicle charger to an electric grid, the system comprising an electric grid, wherein the electric grid is configured to trickle charge the electric vehicle recharging component, an electric vehicle recharging component connected to at least the electric grid, the electric vehicle recharging component comprising, at least a battery storage system, a power delivery station configured to deliver power to an energy source of an electric vehicle, and a computer device, the computer device configured to detect a failure of the electric grid, and power the electric grid in an event of the failure.

20 Claims, 8 Drawing Sheets

(56) References Cited

U.S. PATENT DOCUMENTS

| | | | |
|---|---|---|---|
| 2013/0113413 A1* | 5/2013 | Harty | B60L 53/305 |
| | | | 320/101 |
| 2013/0241485 A1 | 9/2013 | Snyder | |
| 2017/0106764 A1* | 4/2017 | Beaston | B60L 53/66 |
| 2018/0233929 A1 | 8/2018 | Schultz | |

OTHER PUBLICATIONS

Osama Saadeh *, Anwar Al Nawasrah and Zakariya Dalala, A Bidirectional Electrical Vehicle Charger and Grid Interface for Grid Voltage Dip Mitigation, Jul. 23, 2020.

Kang Miao Tan, Vigna K. Ramachandaramurthy and Jia Ying Yong, Bidirectional Battery Charger for Electric Vehicle, Jan. 1, 2014.

Javier Gallardo-Lozano?, M. Isabel Milanes-Montero, Miguel A. Guerrero-Marténez, Enrique Romero-Cadaval, Electric vehicle battery charger for smart grids, Apr. 23, 2012.

Saad Ullah Khan 1 ID, Khawaja Khalid Mehmood 1 ID, Zunaib Maqsood Haider 1, Syed Basit Ali Bukhari 1 ID, Soon-Jeong Lee 2, Muhammad Kashif Rafique 1 and Chul-Hwan Kim, Energy Management Scheme for an EV Smart Charger V2G/G2V Application with an EV Power Allocation Technique and Voltage Regulation, Apr. 21, 2018.

Shi Rui, Chi Zhong, Chen Yanxia, Bidirectional power transfer control based on V2G concept, Dec. 7, 2014.

Morris Brenna1 • Federica Foiadelli1 • Carola Leone1 • Michela Longo, Electric Vehicles Charging Technology Review and Optimal Size Estimation, Oct. 2, 2020.

* cited by examiner

SYSTEM FOR CHARGING FROM AN ELECTRIC VEHICLE CHARGER TO AN ELECTRIC GRID

FIELD OF THE INVENTION

The present invention generally relates to the field of charging systems for an electric aircraft. In particular, the present invention is directed to a system for charging from an electric vehicle charger to an electric grid.

BACKGROUND

Electric charging grids and stations that charge more than just electric vehicles face the primary obstacle of reducing the waste of electric energy coupled with providing enough energy in circumstances surrounding failure of said electric grid or charging station. Electric vehicles can be charged relatively quickly from an electric vehicle recharging station without any significant problem but when a multitude of electric vehicle recharging stations are using power sourced from a singular electric grid, it will impose tremendous problem on the grid stability due to frequency fluctuation and other factors.

SUMMARY OF THE DISCLOSURE

In an aspect a system for charging from an electric vehicle charger to an electric grid, the system including at least a battery storage system. The system further includes a power delivery station wherein the power delivery station is configured to deliver power to an energy source of an electric vehicle. The system further includes a computer device wherein the computer device is configured to detect a failure of the electric grid and power the electric grid as a function of the detection of the failure wherein the power delivery station is configured to charge using an electric vehicle recharging component.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations, and fragmentary views. In certain instances, details that are not necessary for an understanding of the embodiments or that render other details difficult to perceive may have been omitted.

DETAILED DESCRIPTION

At a high level, aspects of the present disclosure are directed a system for charging from an electric vehicle charger to an electric grid. The system includes at least a battery storage system. The system further includes a power delivery station wherein the power delivery station is configured to deliver power to an energy source of an electric vehicle. The system further includes a computer device wherein the computer device is configured to detect a failure of the electric grid and power the electric grid in the event of a failure using an electric vehicle recharging component that supports trickle charging.

Figure 1:
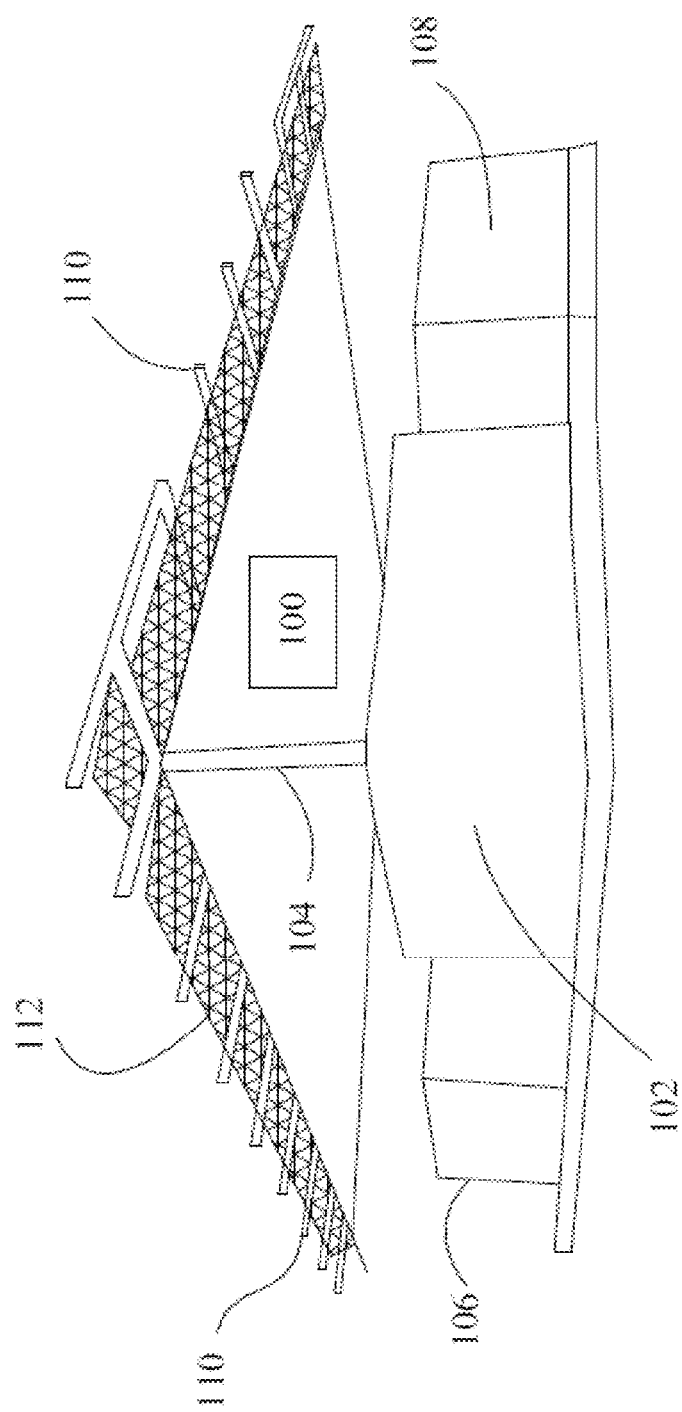
FIG. 1 is a side view of an exemplary embodiment of a recharging station.

Referring now to FIG. 1, an exemplary embodiment of a system 100 for charging of an electric grid using an electric vehicle recharging. "Electric vehicle recharging component," for the purposes of this disclosure, refer to a device or infrastructure that may recharge or discharge an energy source of an electric vehicle. In some embodiments, an electric vehicle recharging component 100 may be constructed from any of variety of suitable materials or any combination thereof. In some embodiments, electric vehicle recharging component 100 may be constructed from metal, concrete, polymers, or other durable materials. In one embodiment, electric vehicle recharging component 100 may be constructed from a lightweight metal alloy. In some embodiments, electric vehicle recharging station 100 may include a helideck or helipad.

With continued reference to FIG. 1, electric vehicle recharging component may include, but not limited to, an electric vehicle recharging station, electric recharging point, charging point, charge point, electronic charging station, and electric vehicle supply equipment. For instance and without limitation, electric vehicle recharging component may be consistent with disclosure of electric vehicle recharging component in U.S. patent application Ser. No. 17/361,911 and titled "RECHARGING STATION FOR ELECTRIC AIRCRAFTS AND A METHOD OF ITS USE", which is incorporated herein by reference in its entirety. In a non-limiting embodiment, electric vehicle recharging component may further include a constant voltage charger, a constant current charger, a taper current charger, a pulsed current charger, a negative pulse charger, an IUI charger, a trickle charger and/or a float charger. In some embodiments, power delivery unit may be configured to deliver power stored from a power storage unit. In one embodiment, power storage unit may have a capacity of at least 500 kwh. In some embodiments, power delivery unit may be configured to connect to power storage unit through a DC to DC converter. In one embodiment, elevated landing pad may include an integrated lighting system. In some embodiments, integrated lighting system may include LEDs with night vision goggle compatibility. In one embodiment, elevated landing pad may include an integrated deicing system. In one embodiment, power delivery unit may be configured to connect to power storage unit through a DC to DC converter. In another embodiment, two or more electric aircrafts may be charged through the rechargeable component. Electric vehicle recharging station 100 may further include a battery that may further include a power supply unit. The power supply unit may be mechanically coupled to the electric vehicle recharging station and/or an electric charger. The power supply unit may have electrical components that may be configured to receive electrical power, which may include alternating current ("AC") and/or direct current ("DC") power, and output DC and/or AC power in a useable voltage, current, and/or frequency. In one embodiment, the power supply unit may include a power storage unit 108. The power storage unit 108 may be configured to store 500 kwh of electrical energy. In another embodiment, power storage unit 108 may be configured to store more than 500 kwh of electrical energy. Power storage unit 108 may house a variety of electrical components. In one embodiment, power storage unit 108 may contain a solar inverter. The solar inverter may be configured to produce on-site power generation. In one embodiment, the power generated from the solar inverter may be stored in power storage unit 108. In some embodiments, power storage unit 108 may include a used electric aircraft battery pack no longer fit for flight.

With continued reference to FIG. 1, electric vehicle recharging station 100 may have a support component 102 coupled to recharging station 100. In one embodiment, support component 102 may include a support column 104. Support column 104 may be made from a variety of suitable materials, which may include without limitation any materials described above as suitable for the recharging station 100, to support one or more aircrafts on an electric vehicle recharging station 100. In some embodiments the support column 104 may be made from a lightweight metal alloy. In some embodiments, a support component 102 may be coupled to the recharging station 100. The support component 102 may be beneath the recharging station 100 to provide structural support and elevation. Support component 102 may have a plurality of support columns 104. The recharging pad 100 may also include supporting structures 110. Supporting structures 110 may provide additional structural support to the recharging station 100. Supporting structures 100 may have a net meshing 112. Net meshing 112 may include a variety of suitable materials. In one embodiment, net meshing 112 may include, without limitation, polyester, nylon, polypropylene, polyethylene, PVC, and PTFE. Net meshing 112 may provide additional support to recharging station 100. Net meshing 112 may also act as a safety measure to prevent persons or cargo from falling off recharging station 100.

Still referring to FIG. 1, support component 102 may comprise a plurality of modular housings 106. Modular housings 106 may be configured based on the needs of a mission or location. For example, modular housings 106 may contain a hotel container for the pilot and flight crew to rest in. In one embodiment, a hotel container may include a bed, bathroom, shower, and integrated water heaters. In another embodiment, the modular housings 106 may have a control room for pilots and flight crew to relax, eat, study, and plan their next mission. In another embodiment, a unit of a modular housings 106 may include an electrical power supply 108. Electrical power supply may include an electrical storage unit such as a battery storage system. "Battery storage system," for the purposes of this disclosure, refer to a device or station that may include a plurality of batteries to be used to store electrical energy. The battery storage system may contain a plurality of battery cells, a solar inverter, a power grid component, and power distribution panels. Any component of electrical power supply may include, be included in, share components with, and/or be implemented according to any other electrical power supplies, storage units, or the like as described in this disclosure. In one embodiment, the plurality of modular housings of a support component 102 may enable quick construction and deconstruction of an electric vehicle recharging station 100. In one embodiment, a support component 102 may be constructed on top of one or more buildings. In another embodiment, a support component 102 may be constructed in a remote location. In one embodiment, one of the modular housings of support component 102 may have a hotel container. The hotel container may include a bed, a bathroom, a shower, and a sink. In some embodiments, the hotel container may also serve as a storage unit for freshwater, gray water, and blackwater. In other embodiments, the hotel container may serve as a storage unit for a plumbing system. In some embodiments, a plumbing system may be integrated throughout support component 102. In one embodiment, a plumbing system may include integrated water heaters. In some embodiments, the support component 102 may have a hydraulic lift system. In one embodiment, the hydraulic lift system may be configured to ascend or descend one or more persons and cargo to the recharging station 100. In some embodiments, support component 102 may be configured to connect to a surrounding plumbing system. In some embodiments, support component 102 may be configured to connect to a surrounding sewage system. In other embodiments, support component 102 may be configured to connect to a septic tank system.

Figure 2:
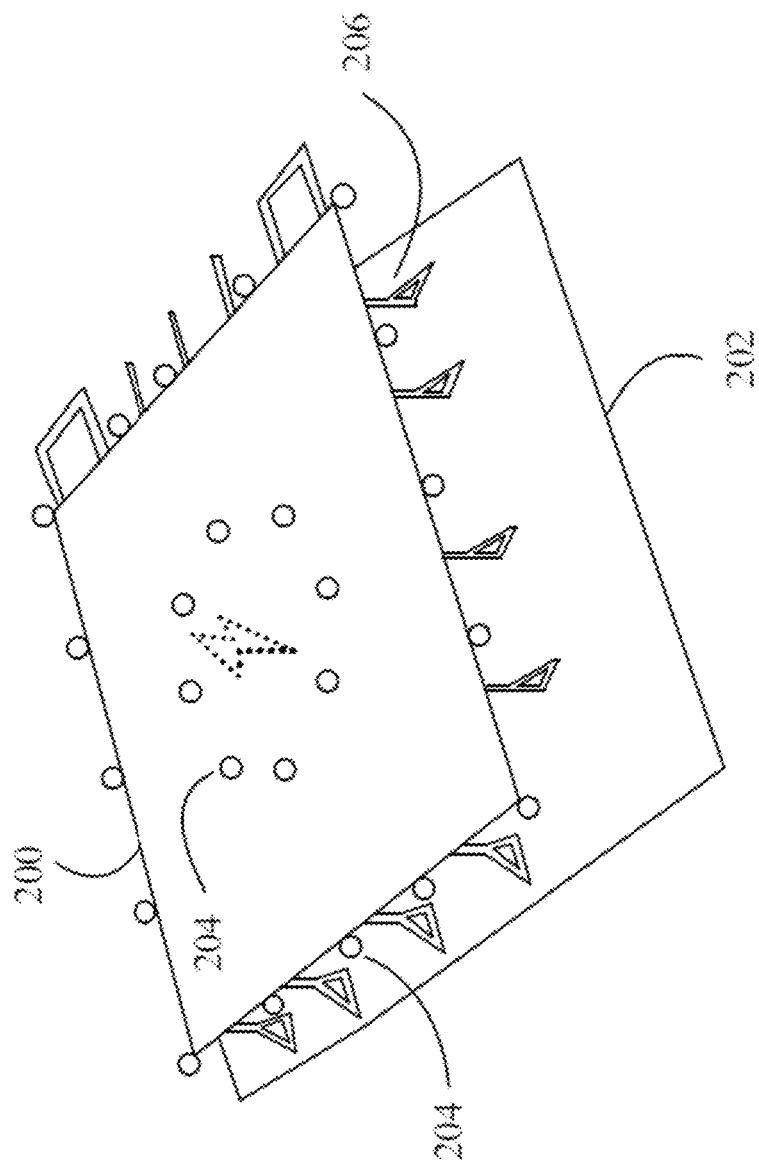
FIG. 2 is a top view of an exemplary embodiment of a recharging station.

Referring now to FIG. 2, an illustration of a top view of an embodiment of a recharging station 200 is presented. Recharging station 200 may include an integrated lighting system 204. In one embodiment, the integrated lighting system may include a plurality of light sources 204, such as fluorescent, OLED, incandescent, halogen, metal halide, neon, high intensity discharge, low pressure sodium, and LEDS 204. In one embodiment, light sources 204 may be green. In one embodiment, light sources 204 of the integrated lighting system may include night vision compatibility. In one embodiment, light sources 204 may be able to change colors. In another embodiment, light sources 204 may be configured to switch on and off in a pattern to signal to aircraft various messages, such as a SOS message. Recharging station 200 may further include an integrated deicing system. The integrated deicing system may be configured to keep recharging pad 200 free of weather obstruction such as snow, ice, sleet, or hail. In one embodiment, recharging station 200 may have supporting structures 206. Supporting structures 206 may be configured to support one or more electric aircrafts on recharging station 200. In one embodiment, recharging pad 200 may have a supported base 202. Supported base 202 may be configured to be wider than recharging station 200. Support base 202 may also provide a foundation for other supporting components such as modular units. In another embodiment, support base 202 may have an integrated heating and lighting system.

Figure 3:
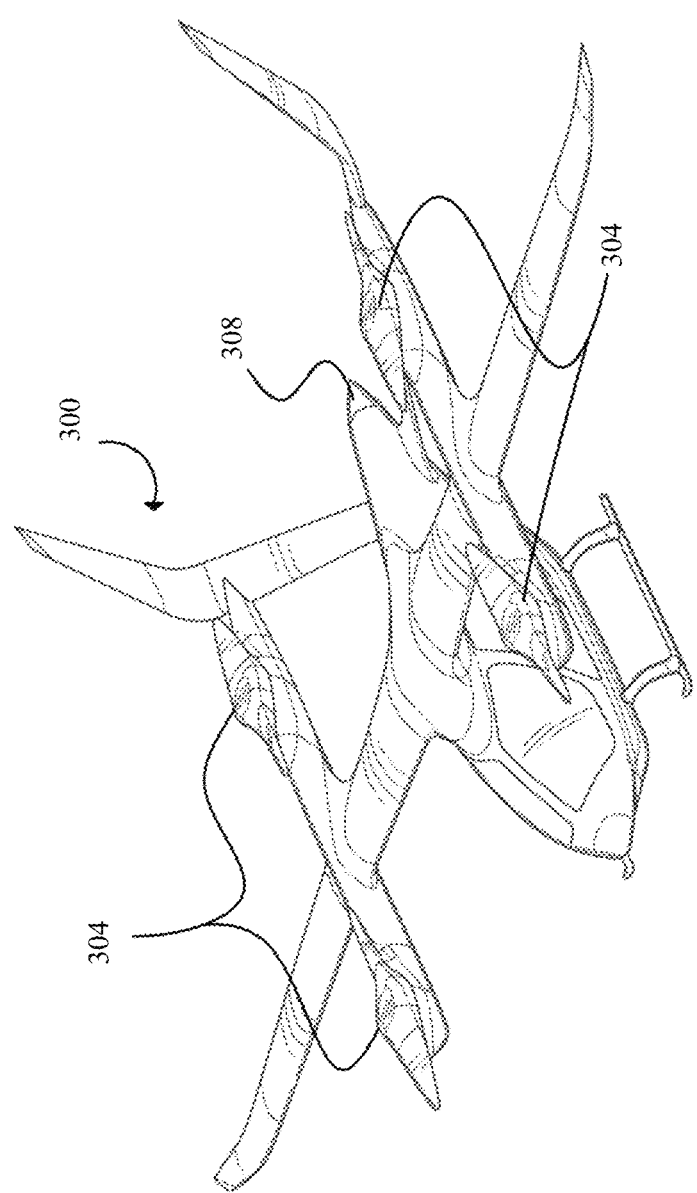
FIG. 3 is an illustration of an embodiment of an electric aircraft.

Referring now to FIG. 3, an embodiment of an electric aircraft 300 is presented. Still referring to FIG. 3, electric aircraft 300 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

With continued reference to FIG. 3, a number of aerodynamic forces may act upon the electric aircraft 300 during flight. Forces acting on an electric aircraft 300 during flight may include, without limitation, thrust, the forward force produced by the rotating element of the electric aircraft 300 and acts parallel to the longitudinal axis. Another force acting upon electric aircraft 300 may be, without limitation, drag, which may be defined as a rearward retarding force which is caused by disruption of airflow by any protruding surface of the electric aircraft 300 such as, without limitation, the wing, rotor, and fuselage. Drag may oppose thrust and acts rearward parallel to the relative wind. A further force acting upon electric aircraft 300 may include, without limitation, weight, which may include a combined load of the electric aircraft 300 itself, crew, baggage, and/or fuel. Weight may pull electric aircraft 300 downward due to the force of gravity. An additional force acting on electric aircraft 300 may include, without limitation, lift, which may act to oppose the downward force of weight and may be produced by the dynamic effect of air acting on the airfoil and/or downward thrust from the propulsor of the electric aircraft. Lift generated by the airfoil may depend on speed of airflow, density of air, total area of an airfoil and/or segment thereof, and/or an angle of attack between air and the airfoil. For example, and without limitation, electric aircraft 300 are designed to be as lightweight as possible. Reducing the weight of the aircraft and designing to reduce the number of components is essential to optimize the weight. To save energy, it may be useful to reduce weight of components of an electric aircraft 300, including without limitation propulsors and/or propulsion assemblies. In an embodiment, the motor may eliminate need for many external structural features that otherwise might be needed to join one component to another component. The motor may also increase energy efficiency by enabling a lower physical propulsor profile, reducing drag and/or wind resistance. This may also increase durability by lessening the extent to which drag and/or wind resistance add to forces acting on electric aircraft 300 and/or propulsors.

Referring still to FIG. 3, Aircraft may include at least a vertical propulsor 304 and at least a forward propulsor 308. A forward propulsor is a propulsor that propels the aircraft in a forward direction. Forward in this context is not an indication of the propulsor position on the aircraft; one or more propulsors mounted on the front, on the wings, at the rear, etc. A vertical propulsor is a propulsor that propels the aircraft in an upward direction; one of more vertical propulsors may be mounted on the front, on the wings, at the rear, and/or any suitable location. A propulsor, as used herein, is a component or device used to propel a craft by exerting force on a fluid medium, which may include a gaseous medium such as air or a liquid medium such as water. At least a vertical propulsor 304 is a propulsor that generates a substantially downward thrust, tending to propel an aircraft in a vertical direction providing thrust for maneuvers such as without limitation, vertical take-off, vertical landing, hovering, and/or rotor-based flight such as "quadcopter" or similar styles of flight.

With continued reference to FIG. 3, at least a forward propulsor 308 as used in this disclosure is a propulsor positioned for propelling an aircraft in a "forward" direction; at least a forward propulsor may include one or more propulsors mounted on the front, on the wings, at the rear, or a combination of any such positions. At least a forward propulsor may propel an aircraft forward for fixed-wing and/or "airplane"-style flight, takeoff, and/or landing, and/or may propel the aircraft forward or backward on the ground. At least a vertical propulsor 304 and at least a forward propulsor 308 includes a thrust element. At least a thrust element may include any device or component that converts the mechanical energy of a motor, for instance in the form of rotational motion of a shaft, into thrust in a fluid medium. At least a thrust element may include, without limitation, a device using moving or rotating foils, including without limitation one or more rotors, an airscrew or propeller, a set of airscrews or propellers such as contrarotating propellers, a moving or flapping wing, or the like. At least a thrust element may include without limitation a marine propeller or screw, an impeller, a turbine, a pump-jet, a paddle or paddle-based device, or the like. As another non-limiting example, at least a thrust element may include an eight-bladed pusher propeller, such as an eight-bladed propeller mounted behind the engine to ensure the drive shaft is in compression. Propulsors may include at least a motor mechanically coupled to the at least a first propulsor as a source of thrust. A motor may include without limitation, any electric motor, where an electric motor is a device that converts electrical energy into mechanical energy, for instance by causing a shaft to rotate. At least a motor may be driven by direct current (DC) electric power; for instance, at least a first motor may include a brushed DC at least a first motor, or the like. At least a first motor may be driven by electric power having varying or reversing voltage levels, such as alternating current (AC) power as produced by an alternating current generator and/or inverter, or otherwise varying power, such as produced by a switching power source. At least a first motor may include, without limitation, brushless DC electric motors, permanent magnet synchronous at least a first motor, switched reluctance motors, or induction motors. In addition to inverter and/or a switching power source, a circuit driving at least a first motor may include electronic speed controllers or other components for regulating motor speed, rotation direction, and/or dynamic braking. Persons skilled in the art, upon reviewing the entirety of this disclosure, will be aware of various devices that may be used as at least a thrust element.

With continued reference to FIG. 3, during flight, a number of forces may act upon the electric aircraft. Forces acting on an aircraft 300 during flight may include thrust, the forward force produced by the rotating element of the aircraft 300 and acts parallel to the longitudinal axis. Drag may be defined as a rearward retarding force which is caused by disruption of airflow by any protruding surface of the aircraft 300 such as, without limitation, the wing, rotor, and fuselage. Drag may oppose thrust and acts rearward parallel to the relative wind. Another force acting on aircraft 300 may include weight, which may include a combined load of the aircraft 300 itself, crew, baggage, and fuel. Weight may pull aircraft 300 downward due to the force of gravity. An additional force acting on aircraft 300 may include lift, which may act to oppose the downward force of weight and may be produced by the dynamic effect of air acting on the airfoil and/or downward thrust from at least a propulsor. Lift generated by the airfoil may depends on speed of airflow, density of air, total area of an airfoil and/or segment thereof, and/or an angle of attack between air and the airfoil.

Figure 4:
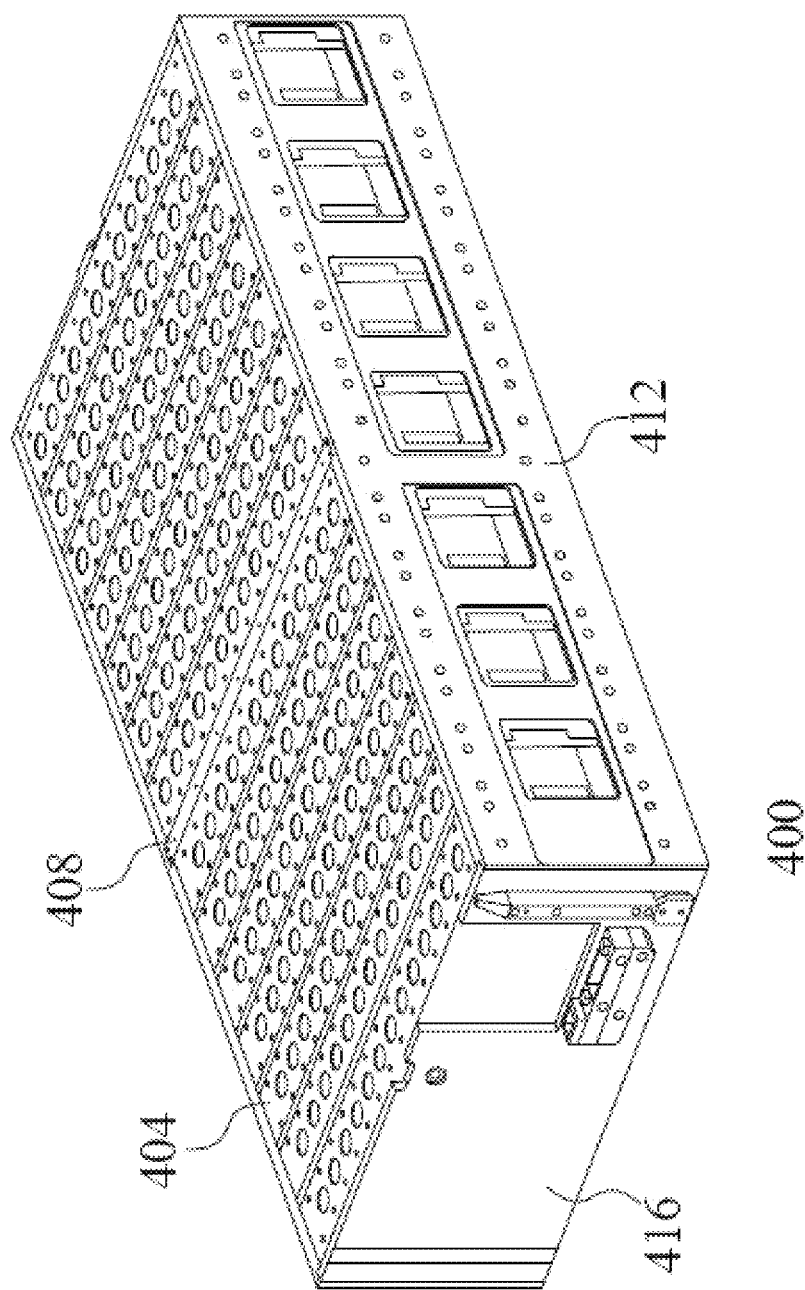
FIG. 4 is an exemplary embodiment of a battery pack.

FIG. 4 illustrates an exemplary embodiment of a battery pack 400 that may be housed in the power storage unit to store power. Battery pack 400 may be a power storing device that is configured to store electrical energy in the form of a plurality of battery modules, which themselves may be comprised of a plurality of electrochemical cells. These cells may utilize electrochemical cells, galvanic cells, electrolytic cells, fuel cells, flow cells, and/or voltaic cells. In general, an electrochemical cell is a device capable of generating electrical energy from chemical reactions or using electrical energy to cause chemical reactions. Voltaic or galvanic cells are electrochemical cells that generate electric current from chemical reactions, while electrolytic cells generate chemical reactions via electrolysis. In general, the term 'battery' is used as a collection of cells connected in series or parallel to each other. A battery cell may, when used in conjunction with other cells, be electrically connected in series, in parallel or a combination of series and parallel. Series connection comprises wiring a first terminal of a first cell to a second terminal of a second cell and further configured to comprise a single conductive path for electricity to flow while maintaining the same current (measured in Amperes) through any component in the circuit. A battery cell may use the term 'wired', but one of ordinary skill in the art would appreciate that this term is synonymous with 'electrically connected', and that there are many ways to couple electrical elements like battery cells together. An example of a connector that does not comprise wires may be prefabricated terminals of a first gender that mate with a second terminal with a second gender. Battery cells may be wired in parallel. Parallel connection comprises wiring a first and second terminal of a first battery cell to a first and second terminal of a second battery cell and further configured to comprise more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, battery pack 400 may include at least 196 battery cells in series and at least 18 battery cells in parallel. This is, as someone of ordinary skill in the art would appreciate, only an example and battery pack 400 may be configured to have a near limitless arrangement of battery cell configurations.

With continued reference to FIG. 4, battery pack 400 may include a plurality of battery modules 404. The battery modules may be wired together in series and in parallel. Battery pack 400 may include a center sheet 408 which may include a thin barrier. The barrier may include a fuse connecting battery modules on either side of center sheet 408. The fuse may be disposed in or on center sheet 408 and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may comprise a thermal fuse, mechanical fuse, blade fuse, expulsion fuse, spark gap surge arrestor, varistor, or a combination thereof.

Still referring to FIG. 4, battery pack 400 may also include a side wall 412 which may include a laminate of a plurality of layers configured to thermally insulate the plurality of battery modules 404 from external components of battery pack 400. Side wall 412 layers may include materials which possess characteristics suitable for thermal insulation such as fiberglass, air, iron fibers, polystyrene foam, and thin plastic films. Side wall 412 may additionally or alternatively electrically insulate the plurality of battery modules 404 from external components of battery pack 400 and the layers of which may include polyvinyl chloride (PVC), glass, asbestos, rigid laminate, varnish, resin, paper, Teflon, rubber, and mechanical lamina. Center sheet 408 may be mechanically coupled to side wall 412. Side wall 412 may include a feature for alignment and coupling to center sheet 408. This feature may comprise a cutout, slots, holes, bosses, ridges, channels, and/or other undisclosed mechanical features, alone or in combination.

Battery pack 400 may also include an end panel 416 having a plurality of electrical connectors and further configured to fix battery pack 400 in alignment with at least a side wall 412. End panel 416 may include a plurality of electrical connectors of a first gender configured to electrically and mechanically couple to electrical connectors of a second gender. End panel 416 may be configured to convey electrical energy from battery cells to at least a portion of an eVTOL aircraft. Electrical energy may be configured to power at least a portion of an eVTOL aircraft or comprise signals to notify aircraft computers, personnel, users, pilots, and any others of information regarding battery health, emergencies, and/or electrical characteristics. The plurality of electrical connectors may comprise blind mate connectors, plug and socket connectors, screw terminals, ring and spade connectors, blade connectors, and/or an undisclosed type alone or in combination. The electrical connectors of which end panel 416 comprises may be configured for power and communication purposes.

A first end of end panel 416 may be configured to mechanically couple to a first end of a first side wall 412 by a snap attachment mechanism, similar to end cap and side panel configuration utilized in the battery module. To reiterate, a protrusion disposed in or on end panel 416 may be captured, at least in part, by a receptacle disposed in or on side wall 412. A second end of end panel 416 may be mechanically coupled to a second end of a second side wall 412 in a similar or the same mechanism.

Figure 5:
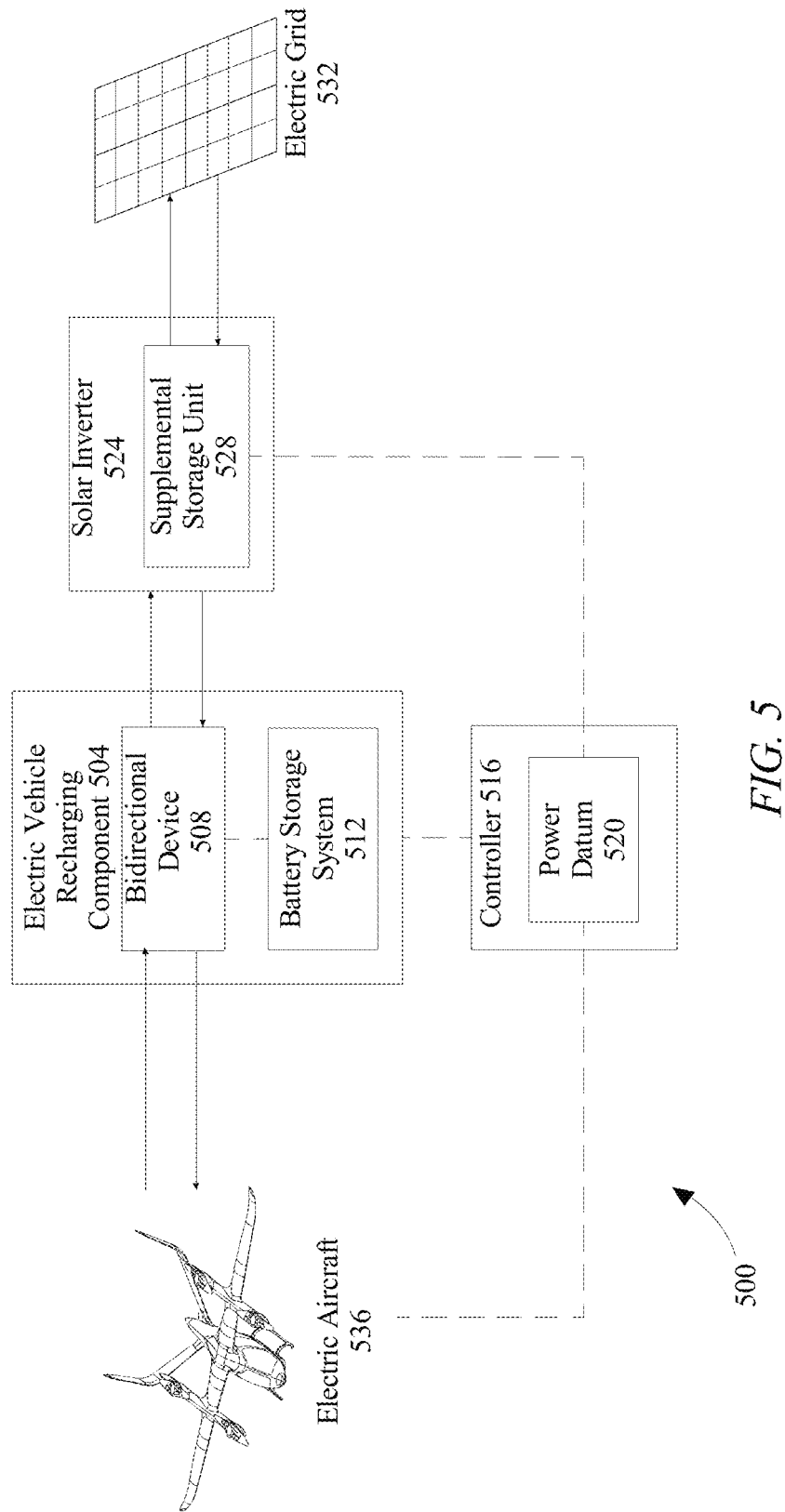
FIG. 5 is a block diagram of an exemplary embodiment of a recharging system for charging an electric grid.

Referring now to FIG. 5, an exemplary illustration of a trickle charging system from an electric vehicle recharging system to an electric grid is presented in a block diagram. The electric aircraft 536 may be electrically coupled to an electric vehicle recharging component 504. Th electric vehicle recharging component may include any infrastructure that may allow for the recharging of an electric aircraft including, but not limited to, an electric recharging station. Electric vehicle recharging component 504 may have a plurality of connections to comply with various electric air vehicle needs. In one embodiment, electric vehicle recharging component 504 may connect to manned and unmanned electric aircrafts of various sizes, such as an EVTOL or a drone. In another embodiment, electric vehicle recharging component 504 may switch between power transfer standards such as the combined charging system standard (CCS) and CHAdeMO standards. In another embodiment, recharging component 504 may adapt to multiple demand response interfaces. Electric vehicle recharging component 504 may include an ADR 2.0 as a demand response interface.

With continued reference to FIG. 5, system 500 may include a bidirectional charging system. Bidirectional charging system may include at least a vehicle-to-grid (V2G) system, at least a grid-to-vehicle (G2V) system, or combination thereof. V2G system may include a bidirectional electric vehicle charger such as a trickle charger and may be used to supply power from an electric aircraft's battery or an electric vehicle recharging component's battery to an electric grid via a DC to AC converter system usually embedded in the electric vehicle recharging component. In a non-limiting embodiment, V2G may be used to balance and settle local, regional, or national energy needs via smart charging. For example, the system 500 may power an electric grid 532 in the event of a failure of the electric grid wherein powering the electric grid may be performed via trickle charging by a trickle charger from an electric vehicle recharging component. Additionally, system 500 may include a vehicle-to-home charging system. "Failure," for the purposes of this disclosure, refer to defects in design, process, quality, or part application, which are the underlying cause of a failure, or which initiate a process which leads to failure. Failure may further refer to a state or event of an electrical component that is unable to perform the action of delivering electrical energy. In a non-limiting embodiment, a bidirectional electric vehicle charger may be used to supply power from an electric aircraft's battery or an electric vehicle recharging component's battery to a house or, possibly, another kind of infrastructure. This may be done via a DC to AC converter system usually embedded within the electric vehicle charger. Like V2G, V2H may help to make balance and settle, at a larger scale, local or even national supply grids. In a non-limiting embodiment, the electric vehicle recharging component 504 may trickle charge an electric grid 532 by delivering electricity to the electric grid's supplemental storage unit 528 from the electric vehicle recharging component's battery storage system 512. "Charging," for the purposes of this disclosure, refer to the process of charging a fully charged battery at a rate equal to its self-discharge rate, thus enabling the battery to remain at its fully charged level. In a non-limiting embodiment, charging may include trickle charging. In a non-limiting embodiment, the state of fully charged occurs almost exclusively when the battery is not loaded, as trickle charging will not keep a battery charged if current is being drawn by a load, which may include, but not limited to, a battery of an electric aircraft, supplemental storage unit of an electric grid, and the like. Electric vehicle recharging component 504 may further deliver power to an electric grid by trickle charging the electric grid's supplemental storage unit 528 from the electric aircraft's own battery. A person of ordinary skill in the art would appreciate the bidirectional recharging system as described above.

Still referring to FIG. 5, system 500 may include an electric vehicle recharging component 504 which may further include a trickle charger. Electric vehicle recharging component 504 may further include, but not limited to, a constant voltage charger, a constant current charger, a taper current charger, a pulsed current charger, a negative pulse charger, an IUI charger, and a float charger. Trickle charger may include a battery charger that produces a very small current. Trickle charging may include providing a power output exceeding a power consumption requirement of the electric vehicle recharging component 504. "Power consumption requirement," for the purposes of this disclosure, refer to an electrical energy per unit time, required to operate an electrical component. In a non-limiting embodiment, the electric vehicle recharging component may be configured by at least a computing device to increase the power output of the battery storage system 512 of a trickle charger to power an electric grid 532. In a non-limiting embodiment, trickle charging may include charging a battery at a rate equal to a battery's self-discharge rate such that the battery remains at a specific threshold of charge. The computing device may determine a charge cycle including a recharge rate and discharge rate of the battery storage system 512 of the electric vehicle recharging component 504 as a function of at least a machine-learning model. "Charge cycle," for the purposes of this disclosure, refer to a process of recharging and discharging an electric energy source as required into a load which may include, but not limited to, a battery of an electric aircraft, supplemental storage unit of an electric grid, and the like. The charge cycle may be determined as a function of a machine-learning model wherein the machine-learning model may receive a set of training data including, but not limited to, rate of a charge cycle of an electric grid, rate of charge of an electric vehicle, and rate of charge of an electric vehicle recharging component, and train the set with a classification of failure modes to determine the charge cycle to recharge an electric grid when a computing device detects a failure of the electric grid. In a non-limiting embodiment, A trickle charger may deliver a charge cycle that is equal to the batteries rate of self-discharge and should be disconnected once a full charge has been established to avoid overcharging. Electric vehicle recharging component 504 may include a maintenance charger that may be designed to stay connected to a battery storage system 512. Once a charge level is set, the trickle charger may automatically turn off and on to maintain a specified charge range.

Still referring to FIG. 5, system 500 may include a bidirectional device 508. Bidirectional device 508 may include a DC-distribution system, wherein the system is a device that is used to regulate and monitor the flow of power between a DC bus and an AC grid and to restrict the voltage expanse at the former to only a certain permissible range of voltages. In other words, a bi-directional inverter is the one that not only performs the DC to AC conversion, but also performs the conversion of AC power to DC. In a non-limiting embodiment, bidirectional inverter 508 may include a DC to DC bidirectional converter wherein DC to DC bidirectional converter allows power flow in both forward and reverse directions. In a non-limiting embodiment, DC to DC bidirectional inverter may convert a fixed DC battery voltage into a higher DC voltage suitable for traction motor. Bidirectional device 508 may also include, but not limited to, a DC to AC inverter, DC to AC inverter, and the like. In a non-limiting embodiment, electric vehicle recharging component 504 may perform bidirectional charging as a function of an electric vehicle and an electric grid. A person of ordinary skill in the art would appreciate the use of a power inverter in the context of delivering energy from one source to another.

With continued reference to FIG. 5, electric vehicle recharging component 504 may deliver charge to an electric vehicle. In a non-limiting embodiment, the electric vehicle charging component 503 may deliver electric power to an electric aircraft 536 using a trickle charger to trickle charge the electric aircraft as a function of bidirectional charging. The trickle charger may deliver power stored in the battery storage system 512 and/or from a power storage unit directly from an electric grid to power an electric aircraft. Trickle charging an electric aircraft 536 may include a trickle charging a battery storage system 512 within an electric vehicle recharging component 504 to fully charged in which a DC to DC converter may deliver electricity from the battery to the electric aircraft or a battery unit of the electric aircraft.

Still referring to FIG. 5, system 500 may include a battery unit 512. Battery unit 512 may include a power storage unit which may further include at least a battery pack. The battery pack may include a plurality of electrochemical battery cells. Battery storage system 512 may include any battery unit or component described herein. In a non-limiting embodiment, a trickle charger may receive power from a battery storage system 512. Battery storage system 512 may include and/or be associated with a DC to DC converter to convert power into a variety of voltages for electric vehicle recharging component 504. may actively switch between multiple power sources. In one embodiment, battery storage system 512 may switch between power from a supplemental storage unit 528 and power from a solar inverter 524.

With continued reference to FIG. 5, electric vehicle recharging component 504 may trickle back charge via a trickle charger a supplemental storage unit 528 wherein the supplemental storage unit 528 is further configured to power an electric grid 532 in the event of different power capabilities of the electric grid 532. Different power capabilities of the electric grid 532 may include different charge cycles associated with different times during the day. In a non-limiting embodiment, the electric grid 532 may be delivering electric energy to an electric vehicle recharging component 504 at a higher rate of charge during the morning and afternoon of a day and deliver a lower rate of charge during the evening of that day. The electric vehicle recharging component 504 may be configured to, as a function of a computing device 516, trickle back charge the electric grid 532 by delivering electric energy to the supplemental storage unit 528 to power the electric grid 532 by delivering electric energy to compensate for the offset of different rate of charges from the different power capabilities of the electric grid 532 throughout the course of a day. The compensation of electric energy may be determined as a function of a computing device 516 and/or a machine-learning model.

With continued reference to FIG. 5, system 500 also includes an electric grid 532. Electric grid 532 may include, but not limited to, a power station, electrical substation, electric power transmission, electric power distribution, and the like. Electric grid may refer to any interconnected network for delivering electricity from a first entity to a second entity. "Entity," as used in this disclosure, refers to any entity that retrieves, sores, and/or outputs an energy source including, but not limited to, a producer, consumer, home, business, other infrastructure, electric vehicle, eVTOL, and the like. Electric grid 532 may further include at least a photovoltaic (PV) module. The PV module may include but not limited to, a plurality of solar panels, a plurality of solar arrays, or combination thereof. Electric grid 532 may supply electricity to entities within a specific geographical location or deliver electricity from a first entity to a second entity.

Still referring to FIG. 5, electric grid 532 of system 500 may include a solar inverter 524. Solar inverter may include, but not limited to, a stand-alone inverter, grid-tie inverter, battery backup inverter, intelligent hybrid inverter, and the like. Solar inverter 524 may include a type of electrical converter which converts the variable direct current (DC) output of a photovoltaic (PV) solar panel into a utility frequency alternating current (AC) that can be fed into a commercial electrical grid or used by a local, off-grid electrical network. In one embodiment, solar inverter 524 may be configured to absorb solar energy and transform the solar energy into electrical energy. In one embodiment, solar inverter 524 may transform DC to AC. In some embodiments, solar inverter 524 may have a capacity of at least 250 kwh. In other embodiments, solar inverter 524 may have a capacity higher than 250 kwh. In some embodiments, solar inverter 524 may include a solar panel, electrical grade papers, films, coated cloths, laminates, insulation tape, lead pads, and phase separators. In a non-limiting embodiment, solar inverter 524 may act as a bidirectional gateway between the local installation and an electric grid. the battery unit 512 may be connected on the DC side of the solar inverter to an electric grid 532. The power storage unit may be charged either by using a DC generated from the electric grid 532 or by using the AC/DC path of the inverter 524 connected to the electric grid 532. Additionally, battery storage system 512 can also supply the electric grid 532 with internally stored energy in a supplemental storage unit 528. In a non-limiting embodiment, in installations with a uni-directional inverter, most of the existing installations of the battery storage system 512 could be connected (as an option) on the AC side of the solar inverter 524. Solar inverter 524 may include a second, bi-directional inverter for a charge/discharge capability of the supplemental storage unit 528.

Still referring to FIG. 5, system 500 may include a supplemental storage unit 528 that may be used in bidirectional charging for charging at least an electric grid. In a non-limiting embodiment, supplemental storage unit 528 may receive power from the battery storage system 512 of the electric vehicle recharging component 504. Supplemental storage unit 528 may include one or more batteries, capacitors, inductors, or other electrical power storing components. In a non-limiting embodiment, supplemental storage unit 528 may be responsible for operation of an electric grid 532. For instance, and without limitation, a failure of an electric grid 532 may include the failure of the supplemental storage unit 528. In one embodiment, battery storage system 512 may include repurposed electric aircraft batteries. In some embodiments, supplemental storage unit 528 may have a capacity of at least 500 kwh. In another embodiment, supplemental storage unit 528 may have a capacity of over 500 kwh. In some embodiments, supplemental storage unit 528 may have a connection to electric grid 532. Electric grid 532 may be connected to an external electrical power grid. In some embodiments, electric grid 532 may be configured to slowly charge one or more batteries in supplemental storage unit 528 in order to reduce strain on nearby electrical power grids. In one embodiment, electric grid 532 may have an AC grid current of at least 450 amps. In some embodiments, electric grid 532 may have an AC grid current of more or less than 450 amps. In one embodiment, electric grid 532 may have an AC voltage connection of 480 Vac. In other embodiments, electric grid 532 may have an AC voltage connection of above or below 480 Vac. In some embodiments, supplemental storage unit 528 may provide power to the electric grid 532. In this configuration, supplemental storage unit 528 may provide power to a surrounding electrical power grid.

Still referring to FIG. 5, a controller 516 is included in system 500. Controller 516 may include a computing device. Computing device may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Computing device may include a single computing device operating independently, or may include two or more computing device operating in concert, in parallel, sequentially or the like; two or more computing devices may be included together in a single computing device or in two or more computing devices. Computing device may interface or communicate with one or more additional devices as described below in further detail via a network interface device. Network interface device may be utilized for connecting computing device to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device may include but is not limited to, for example, a computing device or cluster of computing devices in a first location and a second computing device or cluster of computing devices in a second location. Computing device may include one or more computing devices dedicated to data storage, security, distribution of traffic for load balancing, and the like. Computing device may distribute one or more computing tasks as described below across a plurality of computing devices of computing device, which may operate in parallel, in series, redundantly, or in any other manner used for distribution of tasks or memory between computing devices. Computing device may be implemented using a "shared nothing" architecture in which data is cached at the worker, in an embodiment, this may enable scalability of system 500 and/or computing device.

With continued reference to FIG. 5, computing device may be designed and/or configured to perform any method, method step, or sequence of method steps in any embodiment described in this disclosure, in any order and with any degree of repetition. For instance, [computing device may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 5, system 500 including a controller 516 may further include a power datum 520. "Power datum," for the purposes of this disclosure, refer to a physical or electrical value representing the charge and/or flow of electricity from one energy source to another energy source. Controller 516 may further include at least a sensor. Sensor may include, but not limited to, a multimeter, voltmeter, valve electrometer, solid-state electrometer, and the like. Controller 516 may use a machine-learning model to generate power datum 520 using training data from at least an electric aircraft 526, at least an electric vehicle recharging component 504, and at least a solar inverter 524. In a non-limiting embodiment, a computing device may receive a plurality of data from an electric vehicle, electric recharging, and an electric grid to provide ancillary services to the electric recharging system 500. Ancillary services may include functions that help grid operators maintain a reliable electricity system. Ancillary services may maintain the proper flow and direction of electricity, address imbalances between supply and demand, and help the system recover after a power system event. Ancillary services may include recharging an electric grid in the event of a failure of the electric grid wherein the controller may direct a trickle charge from at least a battery storage system 512 to the electric grid's supplemental storage unit 528. In a non-limiting embodiment, controller 516 may use a machine-learning model to perform V2G charging wherein the machine-learning model may generate power datum 520 that may include a discharge and recharge rate for trickle charging that is equal to the power storage unit's rate of self-discharge and should be disconnected once a full charge has been established to avoid overcharging of the electric grid 532. The machine-learning model may further include machine-learning algorithms to calculate a discharge and recharge rate that may optimally deliver electricity from at least an electric vehicle recharging component's battery storage system and at least an electric aircraft's own battery unit to an electric grid in the event of an electric grid's failure without overcharging the electric grid's own power storage unit. In a non-limiting embodiment, a machine-learning model may further detect the state of any battery or power storage unit it may be electronically coupled to and trickle charge any dead battery or power storage unit.

Figure 6:
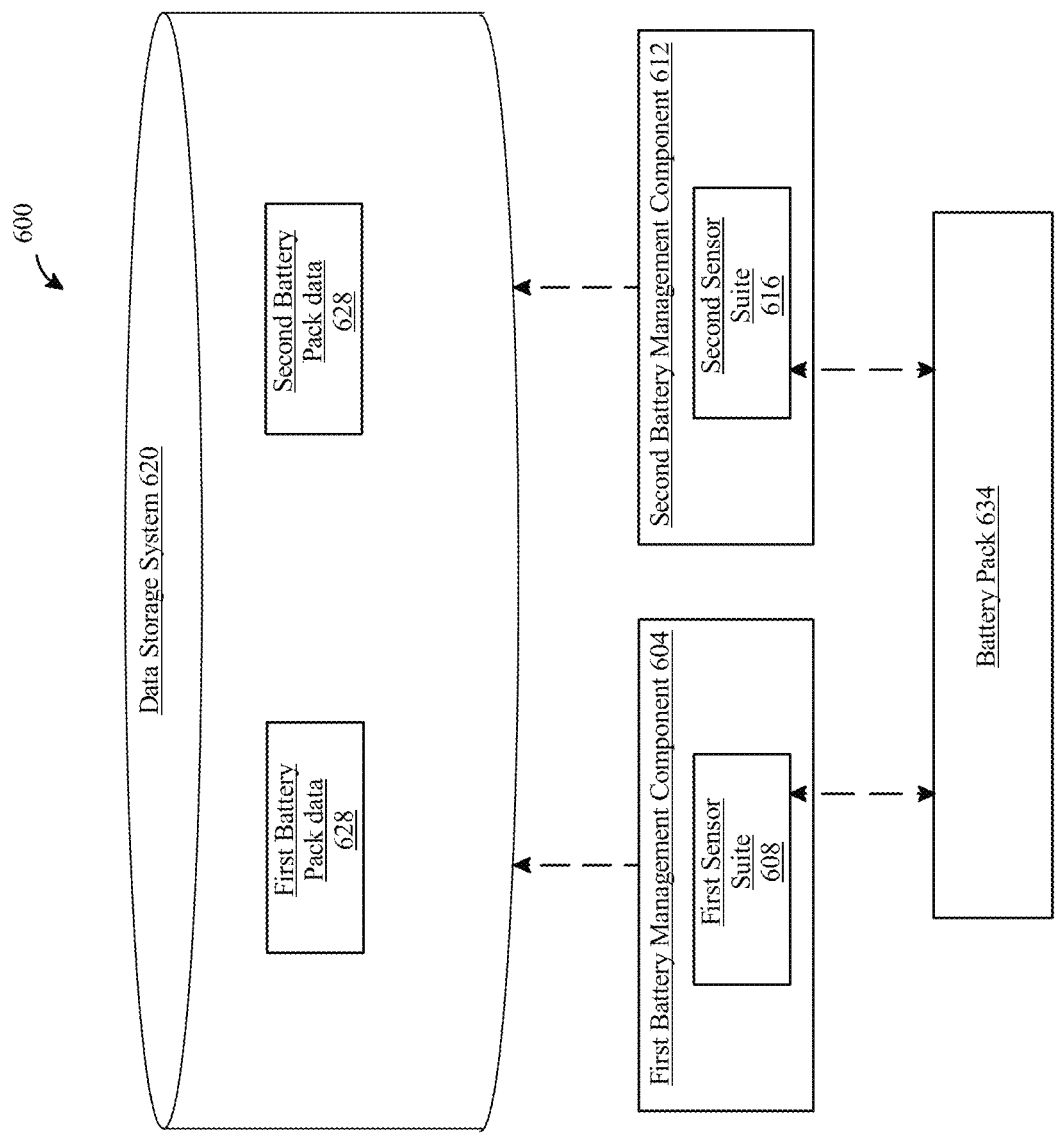
FIG. 6 is a block diagram of a battery charging management system.

Referring now to FIG. 6, an embodiment of battery management system 600 is presented. Battery management system 600 may be integrated in a battery pack configured for use in an electric aircraft. The battery management system 600 may be integrated in a portion of the battery pack or subassembly thereof. Battery management system 600 includes first battery management component 604 disposed on a first end of the battery pack. One of ordinary skill in the art will appreciate that there are various areas in and on a battery pack and/or subassemblies thereof that may include first battery management component 604. First battery management component 604 may take any suitable form. In a non-limiting embodiment, first battery management component 604 may include a circuit board, such as a printed circuit board and/or integrated circuit board, a subassembly mechanically coupled to at least a portion of the battery pack, standalone components communicatively coupled together, or another undisclosed arrangement of components; for instance, and without limitation, a number of components of first battery management component 604 may be soldered or otherwise electrically connected to a circuit board. First battery management component may be disposed directly over, adjacent to, facing, and/or near a battery module and specifically at least a portion of a battery cell. First battery management component 604 includes first sensor suite 608. First sensor suite 608 is configured to measure, detect, sense, and transmit first plurality of battery pack data 628 to data storage system 620, which will be disclosed in further detail with reference to FIG. 6.

Referring again to FIG. 6, battery management system 600 includes second battery management component 612. Second battery management component 612 is disposed in or on a second end of battery pack 634. Second battery management component 612 includes second sensor suite 616. Second sensor suite 616 may be consistent with the description of any sensor suite disclosed herein. Second sensor suite 616 is configured to measure second plurality of battery pack data 632. Second plurality of battery pack data 632 may be consistent with the description of any battery pack data disclosed herein. Second plurality of battery pack data 632 may additionally or alternatively include data not measured or recorded in another section of battery management system 600. Second plurality of battery pack data 632 may be communicated to additional or alternate systems to which it is communicatively coupled. Second sensor suite 616 includes a humidity sensor consistent with any humidity sensor disclosed herein.

With continued reference to FIG. 6, first battery management component 604 disposed in or on battery pack 634 may be physically isolated from second battery management component 612 also disposed on or in battery pack 634. "Physical isolation", for the purposes of this disclosure, refer to a first system's components, communicative coupling, and any other constituent parts, whether software or hardware, are separated from a second system's components, communicative coupling, and any other constituent parts, whether software or hardware, respectively. First battery management component 604 and second battery management component 608 may perform the same or different functions in battery management system 600. In a non-limiting embodiment, the first and second battery management components perform the same, and therefore redundant functions. If, for example, first battery management component 604 malfunctions, in whole or in part, second battery management component 608 may still be operating properly and therefore battery management system 600 may still operate and function properly for electric aircraft in which it is installed. Additionally, or alternatively, second battery management component 608 may power on while first battery management component 604 is malfunctioning. One of ordinary skill in the art would understand that the terms "first" and "second" do not refer to either "battery management components" as primary or secondary. In non-limiting embodiments, first battery management component 604 and second battery management component 608 may be powered on and operate through the same ground operations of an electric aircraft and through the same flight envelope of an electric aircraft. This does not preclude one battery management component, first battery management component 604, from taking over for second battery management component 608 if it were to malfunction. In non-limiting embodiments, the first and second battery management components, due to their physical isolation, may be configured to withstand malfunctions or failures in the other system and survive and operate. Provisions may be made to shield first battery management component 604 from second battery management component 608 other than physical location such as structures and circuit fuses. In non-limiting embodiments, first battery management component 604, second battery management component 608, or subcomponents thereof may be disposed on an internal component or set of components within battery pack 634.

Referring again to FIG. 6, first battery management component 604 is electrically isolated from second battery management component 608. "Electrical isolation", for the purposes of this disclosure, refer to a first system's separation of components carrying electrical signals or electrical energy from a second system's components. First battery management component 604 may suffer an electrical catastrophe, rendering it inoperable, and due to electrical isolation, second battery management component 608 may still continue to operate and function normally, managing the battery pack of an electric aircraft. Shielding such as structural components, material selection, a combination thereof, or another undisclosed method of electrical isolation and insulation may be used, in non-limiting embodiments. For example, a rubber or other electrically insulating material component may be disposed between the electrical components of the first and second battery management components preventing electrical energy to be conducted through it, isolating the first and second battery management components from each other.

With continued reference to FIG. 6, battery management system 600 includes data storage system 620. Data storage system 620 is configured to store first plurality of battery pack data 628 and second plurality of battery pack data 632. Data storage system 620 may include a database. Data storage system 620 may include a solid-state memory or tape hard drive. Data storage system 620 is communicatively coupled to first battery management component 604 and second battery management component 612 and configured to receive electrical signals related to physical or electrical phenomenon measured and store those electrical signals as first battery pack data 628 and second battery pack data 632, respectively. Alternatively, data storage system 620 may include more than one discrete data storage systems that are physically and electrically isolated from each other. In this non-limiting embodiment, each of first battery management component 604 and second battery management component 612 may store first battery pack data 628 and second battery pack data 632 separately. One of ordinary skill in the art would understand the virtually limitless arrangements of data stores with which battery management system 600 could employ to store the first and second plurality of battery pack data.

Referring again to FIG. 6, data storage system 620 may store first plurality of battery pack data 628 and second plurality of battery pack data 632. First plurality of battery pack data 628 and second plurality of battery pack data 632 may include total flight hours battery pack 634 and or electric aircraft have been operating. The first and second plurality of battery pack data may include total energy flowed through battery pack 634. Data storage system 620 may be communicatively coupled to sensors that detect, measure and store energy in a plurality of measurements which may include current, voltage, resistance, impedance, coulombs, watts, temperature, or a combination thereof. Additionally or alternatively, data storage system 620 may be communicatively coupled to a sensor suite consistent with this disclosure to measure physical and/or electrical characteristics. Data storage system 620 may be configured to store first battery pack data 628 and second battery pack data 632 wherein at least a portion of the data includes battery pack maintenance history. Battery pack maintenance history may include mechanical failures and technician resolutions thereof, electrical failures and technician resolutions thereof. Additionally, battery pack maintenance history may include component failures such that the overall system still functions. Data storage system 620 may store the first and second battery pack data that includes an upper voltage threshold and lower voltage threshold consistent with this disclosure. First battery pack data 628 and second battery pack data 632 may include a moisture level threshold. The moisture level threshold may include an absolute, relative, and/or specific moisture level threshold.

With continued reference to FIG. 6, data storage system 620 may include a failure datum. "Failure datum," for the purposes of this disclosure, refer to may include an electrical signal or an element of data identifying and/or describing a failure of at an electrical component including, but not limited to, electric aircraft, electric grid, electric vehicle recharging component, and the like, has occurred. In an embodiment a non-limiting embodiment, a computing device may detect a failure of an electric grid and classify it with a classifier of failure modes to determine the charge cycle necessary to recharge the electric grid. Failure datum may include, as an example and without limitation, a determination that an electric grid is damaged or otherwise operating insufficiently, such as without limitation a determination that an electric grid is delivering less electric energy than expected and/or necessary to produce a level of power to recharge an electric aircraft. As a further example a degree of torque may be sensed, without limitation, using load sensors deployed at and/or around a propulsor and/or by measuring back electromotive force (back EMF) generated by a motor driving the propulsor]

Figure 7:
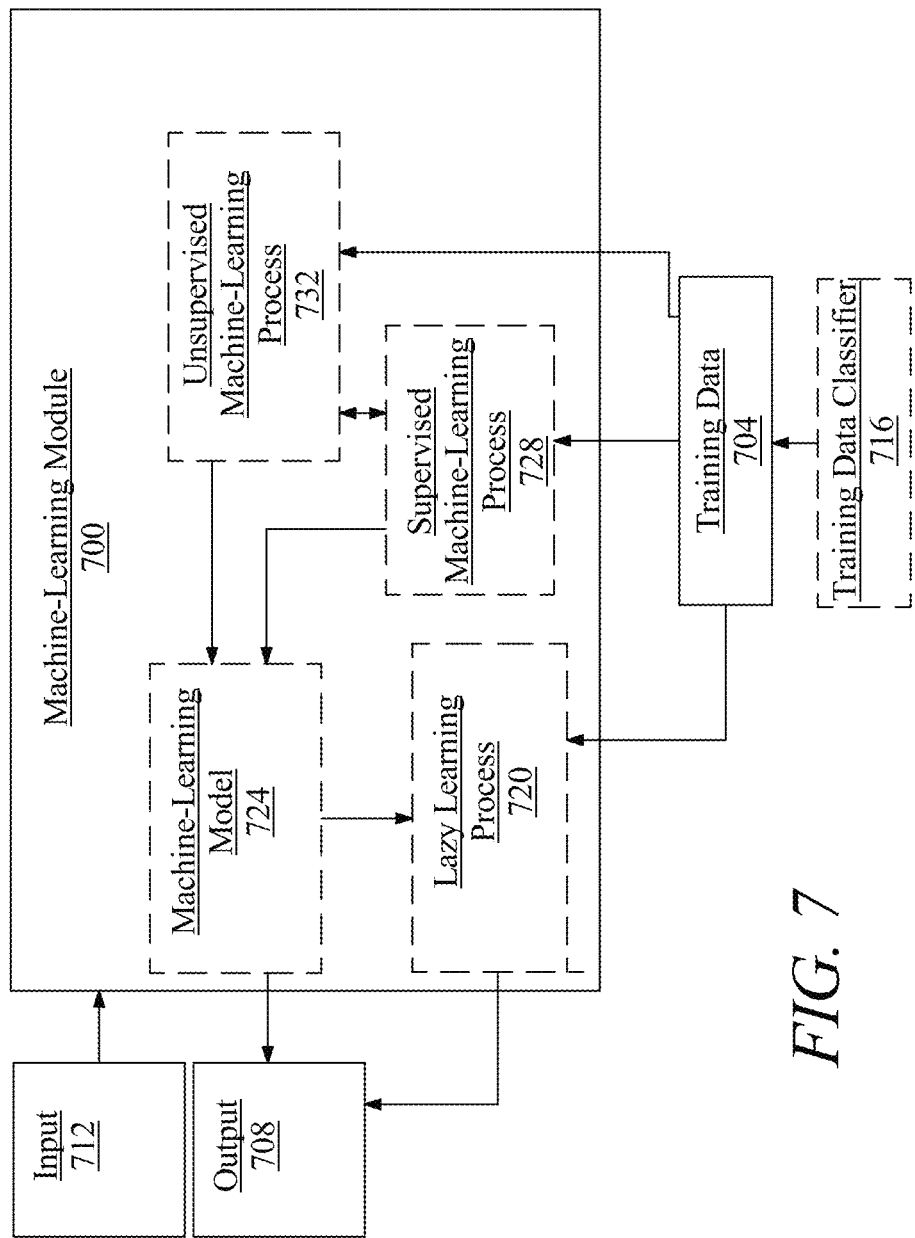
FIG. 7 is a block diagram of an exemplary embodiment of a machine-learning module.

Referring now to FIG. 7, an exemplary embodiment of a machine-learning module 700 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 704 to generate an algorithm that will be performed by a computing device/module to produce outputs 708 given data provided as inputs 712; this is in contrast to a non-machine learning software program where the commands to be executed are determined in advance by a user and written in a programming language.

Still referring to FIG. 7, "training data," as used herein, is data containing correlations that a machine-learning process may use to model relationships between two or more categories of data elements. For instance, and without limitation, training data 704 may include a plurality of data entries, each entry representing a set of data elements that were recorded, received, and/or generated together; data elements may be correlated by shared existence in a given data entry, by proximity in a given data entry, or the like. Multiple data entries in training data 704 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 704 according to various correlations; correlations may indicate causative and/or predictive links between categories of data elements, which may be modeled as relationships such as mathematical relationships by machine-learning processes as described in further detail below. Training data 704 may be formatted and/or organized by categories of data elements, for instance by associating data elements with one or more descriptors corresponding to categories of data elements. As a non-limiting example, training data 704 may include data entered in standardized forms by persons or processes, such that entry of a given data element in a given field in a form may be mapped to one or more descriptors of categories. Elements in training data 704 may be linked to descriptors of categories by tags, tokens, or other data elements; for instance, and without limitation, training data 704 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 7, training data 704 may include one or more elements that are not categorized; that is, training data 704 may not be formatted or contain descriptors for some elements of data. Machine-learning algorithms and/or other processes may sort training data 704 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 704 to be made applicable for two or more distinct machine-learning algorithms as described in further detail below. Training data 704 used by machine-learning module 700 may correlate any input data as described in this disclosure to any output data as described in this disclosure. As a non-limiting illustrative example at least a discharge and/or charge rate of a battery unit of at least an electric aircraft, at least an electric vehicle recharging component, at least an electric grid, at least a solar inverter, and the like, may be inputs and a power datum representing an optimal rate of charge and/or discharge in the context of a bidirectional or V2G charging may be an output.

Further referring to FIG. 7, training data may be filtered, sorted, and/or selected using one or more supervised and/or unsupervised machine-learning processes and/or models as described in further detail below; such models may include without limitation a training data classifier 716. Training data classifier 716 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like.

Machine-learning module 700 may generate a classifier using a classification algorithm, defined as a process whereby a computing device and/or any module and/or component operating thereon derives a classifier from training data 704. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. Training data classifier may include, but not limited to, different levels or power capabilities of an electric grid, different levels of failure modes of an electric grid, and the like.

Still referring to FIG. 7, machine-learning module 700 may be configured to perform a lazy-learning process 720 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 704. Heuristic may include selecting some number of highest-ranking associations and/or training data 704 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 7, machine-learning processes as described in this disclosure may be used to generate machine-learning models 724. A "machine-learning model," as used in this disclosure, is a mathematical and/or algorithmic representation of a relationship between inputs and outputs, as generated using any machine-learning process including without limitation any process as described above and stored in memory; an input is submitted to a machine-learning model 724 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 724 may be generated by creating an artificial neural network, such as a convolutional neural network comprising an input layer of nodes, one or more intermediate layers, and an output layer of nodes. Connections between nodes may be created via the process of "training" the network, in which elements from a training data 704 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 7, machine-learning algorithms may include at least a supervised machine-learning process 728. At least a supervised machine-learning process 728, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include inputs and outputs as described above in this disclosure, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 704. Persons skilled in the art, upon reviewing the entirety of this disclosure, will be aware of various possible variations of at least a supervised machine-learning process 728 that may be used to determine relation between inputs and outputs. Supervised machine-learning processes may include classification algorithms as defined above.

Further referring to FIG. 7, machine learning processes may include at least an unsupervised machine-learning processes 732. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 7, machine-learning module 700 may be designed and configured to create a machine-learning model 724 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 7, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
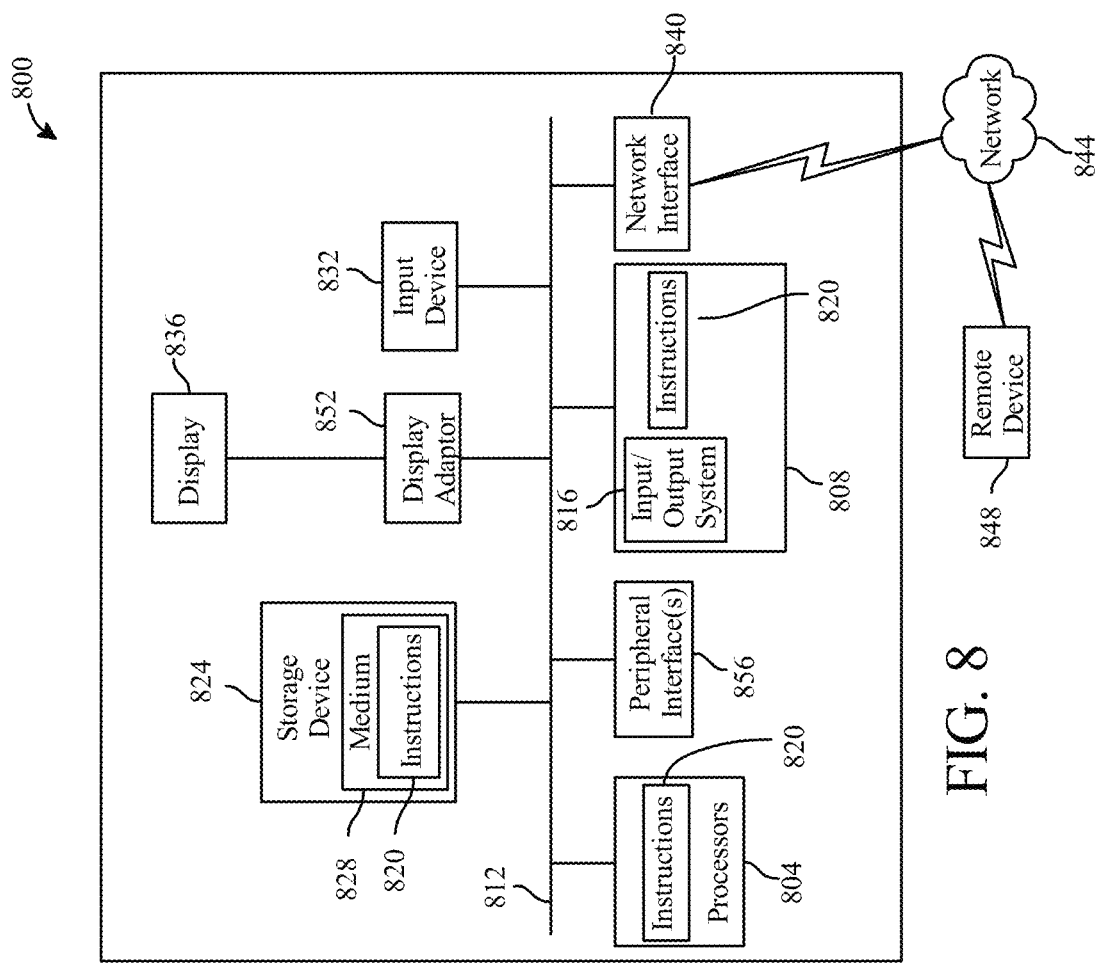
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Processor 804 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 804 may be organized according to Von Neumann and/or Harvard architecture as a non-limiting example. Processor 804 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIRE-WIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve systems and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions, and additions may be made to that which is specifically disclosed herein without departing from the spirit and scope of the present invention.

What is claimed is:

1. A system for charging from an electric aircraft charger to an electric grid, the system comprising:
   at least a battery storage system;
   a power delivery station configured to deliver power to an energy source of an electric aircraft; and
   a computer device, the computer device configured to:
      detect a failure of the electric grid; and
      power the electric grid as a function of the detection of the failure, wherein the power delivery station is configured to charge using an electric vehicle recharging component.

2. The system of claim 1, wherein the power delivery station further comprises a supplemental storage unit that is connected to the power delivery station.

3. The system of claim 2, wherein the supplemental storage unit comprises a battery pack.

4. The system of claim 3, wherein the battery pack comprises a battery management system.

5. The system of claim 1, wherein the power delivery station is configured to support an interconnected network to deliver electricity from a first entity to a second entity.

6. The system of claim 2, wherein the electric grid comprises different power capabilities at different times of the day, wherein the supplemental storage unit is further configured to charge the electric grid to compensate for an offset as a result of the different power capabilities as a function of the vehicle recharging component and the at least the computing device.

7. The system of claim 6, wherein the power delivery station is further configured to compensate the offset by charging a photovoltaic module.

8. The system of claim 7, wherein the photovoltaic module comprises at least a solar panel.

9. The system of claim 7, wherein the photovoltaic module is configured to deliver electricity from a first entity to a second entity.

10. The system of claim 7, wherein the photovoltaic module further comprises at least a solar inverter.

11. The system of claim 1, wherein the electric vehicle recharging component further comprising a charger configured to perform bidirectional charging.

12. The system of claim 1 further configured to charge a battery at a rate equal to the battery's self-discharge rate.

13. The system of claim 1, wherein the computing device is configured to determine a charge cycle as a function of a machine-learning model.

14. The system of claim 1, wherein the computing device is further configured to provide ancillary services to the system.

15. The system of claim 1 further configured to provide a power output exceeding a power consumption requirement of the electric vehicle recharging component.

16. The system of claim 1, wherein the power delivery station further comprises at least a power storage unit mechanically coupled to an electric charger.

17. The system of claim 1, wherein powering the electric grid further comprises charging the electric grid using the electric vehicle recharging component.

18. The system of claim 17, wherein the charging of the electric grid further comprises determining, by a computing device included in the system, a rate of charge as a function of a machine-learning model.

19. The system of claim 17, wherein the charging of the electric grid further is performed automatically by the electric vehicle recharging component as a function of the computing device.

20. The system of claim 1, wherein the electric vehicle recharging station comprises a support column configured to support the electric aircraft.

* * * * *